United States Patent [19]

Van Zeghbroeck

[11] Patent Number: 4,771,194

[45] Date of Patent: Sep. 13, 1988

[54] SENSE AMPLIFIER FOR AMPLIFYING SIGNALS ON A BIASED LINE

[75] Inventor: Bart J. Van Zeghbroeck, Richterswil, Switzerland

[73] Assignee: International Business Machines Corporation, Armonk, N.Y.

[21] Appl. No.: 917,123

[22] Filed: Oct. 9, 1986

[30] Foreign Application Priority Data

Oct. 15, 1985 [EP] European Pat. Off. ........ 85113089.8

[51] Int. Cl.[4] ..................... G01R 19/00; H03K 17/16; H03K 19/017; G11C 7/00
[52] U.S. Cl. .................................... 307/530; 307/443; 307/448; 307/450; 307/354; 365/205; 365/207
[58] Field of Search ............... 307/443, 448, 450, 297, 307/530, 354; 365/205, 207

[56] References Cited

U.S. PATENT DOCUMENTS

| | | | |
|---|---|---|---|
| 3,714,638 | 1/1973 | Dingwall et al. | 340/173 |
| 4,099,264 | 7/1978 | Lodi | 365/205 |
| 4,208,730 | 6/1980 | Dingwall et al. | 365/203 |
| 4,270,190 | 5/1981 | Jindra et al. | 365/208 |
| 4,694,201 | 9/1987 | Jason | 307/443 |

FOREIGN PATENT DOCUMENTS 0158851 12/1979 Japan ................................. 307/297

OTHER PUBLICATIONS

IBM Tech. Disc. Bul., vol. 28, No. 3, Aug. 1985.
IBM Tech. Dis. Bul., Burke, 9/83.
IEEE GaAs IC Symposium, Oct. 23-25, 1984, "A GaAs 4K Bit Static RAM With Normally-On and -Off Combination Circuit", pp. 117-120 of Technical Digest.
"Estimation of GaAs Static RAM Performance", in IEEE Transactions on Electron Devices, vol. Ed-29, No. 7, Jul. 1982, pp. 1130-1135.

Primary Examiner—John S. Heyman
Assistant Examiner—M. R. Wambach
Attorney, Agent, or Firm—Stephen J. Limanek

[57] ABSTRACT

Sense amplifier for use in memory systems, particularly static random access memories (RAM). The sense amplifier circuitry comprises two inverters, one forming a regular amplifier, the other providing a reference voltage ($V_{Ref}$) to the amplifier for determining the optimal operating point ($A_o$) on the inverter's transfer curve, and to a bit line associated with a memory cell being read for biasing the line at its optimal operating level.

The inverters used in the sense amplifier as voltage reference and as amplifier as well as the inverter pairs forming the memory cells may have similar structure and properties and can be formed on the same semiconductor chip.

13 Claims, 2 Drawing Sheets

SENSE AMPLIFIER FOR AMPLIFYING SIGNALS ON A BIASED LINE

TECHNICAL FIELD

This invention relates to a sense amplifier for amplifying signals on a biased line and for generating distinct level digital signals.

BACKGROUND ART

Such amplifier circuits are widely used particularly in digital data processing systems and, more specifically, they are employed in memory systems where, during read-out, the bit storage cells deliver a signal representative of the stored binary value, "1" or "0", which signal needs to be properly recognized and amplified to obtain a digital signal of a distinct level for further processing.

Numerous sense amplifiers, particularly amplifiers for use in semiconductor memory systems have been proposed, all designs aiming at satisfactorily meeting the essential requirements for an amplifier that can be used in today's high density, high speed memories. These amplifiers need to be reliable, fast, sensitive to small signals and they should be of simple structure requiring only a minimum of space on a semiconductor chip. In addition, the circuit must meet these requirements without demanding extremely tight device margins since the unavoidable fabrication process tolerances, which vary widely depending on the technology used, may otherwise not permit the use of high-volume manufacturing processes. Particularly critical in this regard are current gallium arsenide (GaAs) technologies.

A sense amplifier arrangement for use in a semiconductor memory that is typical for today's state of the art has been disclosed at the IEEE GaAs IC Symposium held at Boston, Mass., Oct. 23-25, 1984. Article "A GaAs 4K BIt static RAM with Normally-on and -off Combination Circuit", appearing on pages 117–120 of the Technical Digest of that conference describes a memory system including a storage cell matrix and a sense amplifier which is of the differential amplifier type. Its inputs are connected to the pair of bit lines associated with the storage cells that are represented by the well-known and widely used "6 device cells". So-called 'pull-up' field effect transistors (FET's) serve to bias the lines and to remove any charges on the line before starting the next read operation.

Currently, differential sense amplifiers are frequently employed but this type of amplifier generally needs a second power supply voltage, the circuitry is more complex than that of regular amplifier circuits and, furthermore, it is a true analog circuit which is more difficult to realize than digital circuits, particularly in GaAs technology.

In the article "Estimation of GaAs Static RAM Performance", published in IEEE Transactions on Electron Devices, Vol. ED-29, No. 7, July 1982, pp. 1130–1135, another random access memory (RAM) system is described in which a regular amplifier is provided for each bit line. In contrast to the operation of the differential amplifiers, the regular amplifiers do not compare the two signals appearing on a bit line pair but compare the received signals with a built-in reference. This becomes particularly critical when the signal to be sensed is small compared to the bias voltage that is applied to the bit line. When the reference and the bias voltage do not track, i.e., when deviations from the optimum nominal value are not self-compensated, the realization of amplifiers providing the required reliability becomes critical with today's manufacturing tolerances when several amplifiers are required on the same chip.

DISCLOSURE OF INVENTION

The main object of the present invention is to provide a sense amplifier wherein the most essential characteristics of the employed devices "track", i.e., any deviations in the characteristic of a device should be compensated for by a deviation of a characteristic of an associated device such that the desired result is achieved and virtually not effected by deviations. The deviations may be caused by manufacturing tolerances but also by operational conditions such as changes in temperature.

It is a further object of this invention to provide a reliable, simple and fast sense amplifier that operates with small voltage swings to increase the memory operation speed.

Still another object of this invention is the provide a sense amplifier of simple structure that is easy to manufacture with the same processes used to fabricate the associated memory array.

The invention as claimed is intended to overcome the drawbacks of presently known sense amplifier arrangements and to meet the above objectives. Specific embodiments of the invention, particularly its application in random access memory (RAM) systems, are the subject of an independent claim as well as of a number of dependent claims.

In accordance with the teachings of this invention, sense amplifier circuitry for a memory system is provided which includes two inverters, one forming a regular amplifier and the other providing a voltage reference to the amplifier for determining an optimal operating point for the amplifier and to a bit line associated with, e.g., a memory cell being read for biasing the bit line at its optimal operating level.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
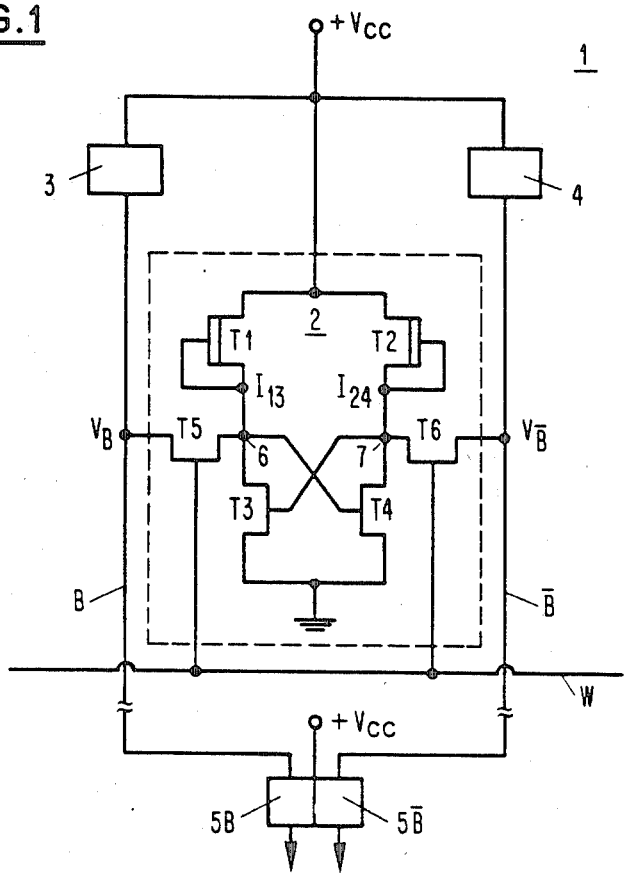
FIG. 1 shows a diagram of a static RAM in which the present invention can be employed, the diagram being restricted to those functional elements that are essential for the operation of the sense amplifier.

Referring now to FIG. 1 of the drawings in more detail, a block diagram of a prior art memory arrangement 1 is illustrated in which the inventive sense amplifier may be used. Shown are a single memory cell 2 with associated row bit lines B and $\overline{B}$, a word line W, two bias circuits 3 and 4, one for each of the bit lines, and a pair of sense amplifiers 5B and 5B̄. In order to keep the diagram simple, it is limited to those functional elements that are essential for the read operations during which signals on bit lines B and/or B̄ that are representative of the bit value stored in the memory cell are to be sensed by the amplifier. Other functional units such as address decoders and write circuitry as well as further memory cells of the memory array are not shown.

The memory cell 2 includes 6 FET's designated T1 through T6. The cell essentially comprises a pair of parallel depletion-load inverters $I_{13}$ and $I_{24}$ each consisting of two series connected FET's: T1 and T3 forming inverter $I_{13}$, T2 and T4 forming inverter $I_{24}$. FET's T1 and T2 are depletion-type FET's, each with a gate-source connection and serving as load devices, whereas FET's T3 and T4 are enhancement-type FET's. Cross-coupling transistors T3 and T4 by connecting their gates with the common points or nodes 6 and 7 of the transistors of the opposite inverter of the cell results in a flip-flop in which, in its stable states, current flows only in one of its two inverters. The two stable states may be referred to as stored bit values "1" and "0", respectively. Two additional pass transistors T5 and T6, normally non-conducting, are connected between the flip-flop at nodes 6 and 7 and the bit lines B and B̄, respectively, as indicated. Select pulses applied to word line W render transistors T5 and T6 conductive.

Bias circuits 3 and 4, connected to bit lines B and B̄, respectively, serve to apply bias voltages $V_B$ and $V_{\bar{B}}$ and to remove any charges before the next read operation is performed. Sense amplifiers 5B and 5B̄ may, in fact, take the form of a single two-input differential amplifier that generates a digital output representative of the bit value stored in cell 2 from the difference of the signals on the two bit lines. On the other hand, a pair of regular amplifiers may be provided that, each operating independently, generate the digital signals corresponding to the stored value. The following explanations refer to an embodiment of the latter type.

It is assumed that the two stable states of cell 2 that represent the stored bit values "1" and "0", respectively, are defined as follows:

"1": current flows through inverter $I_{13}$—the voltage at point 6 is well below $V_{cc}$ and also below the bit line level $V_B$; inverter $I_{24}$ is "off"—point 7 is charged to $V_{cc}$, i.e., higher than bit line level $V_{\bar{B}}$.

"0": current flows through inverter $I_{24}$, the voltage at point 7 is well-below $V_{cc}$ and also below the bit line level $V_{\bar{B}}$; inverter $I_{13}$ is "off"—point 6 is charged to $V_{cc}$, i.e., higher than bit line level $V_B$.

Reading from cell 2 in FIG. 1 is then initiated by applying a select pulse to word line W, in which case the pass transistors T5 and T6 turn "on" thereby connecting the two inverters $I_{13}$ and $I_{24}$ of the flip-flop to the respective bit lines B and B̄. Assuming that, prior to the read operation, inverter $I_{13}$ has been conducting (representing a stored "1"), current will now flow from voltage source $V_{cc}$ through bias circuit 3, bit line B, transistor T5 and transistor T3 to ground. As a result, the voltage on bit line B is lowered. This negative voltage swing also occurs at the input of sense amplifier 5B which will generate the desired digital signal for further processing.

Since inverter $I_{24}$ is non-conducting and point 7 is up, there will be no current flow from bit line B̄ through transistors T6 and T4 to ground. To the contrary, a current of opposite direction may flow through transistor T6 since point 7 had been charged to $V_{cc}$ which is higher than the level on B̄. This charge may give rise to a positive voltage swing on line B̄ which will, applied to the input of amplifier 5B̄, cause the generation of a signal of a polarity opposite to that of the output of amplifier 5B. Whether such "complementary" voltage signal is generated depends on the transfer characteristic of the amplifiers and, more particularly, on the location of the operating point on the transfer curve.

In case inverter $I_{24}$ is conducting (representing a stored "0") rather than inverter $I_{13}$, exactly the opposite to the just described process will take place. When reading a stored "0", amplifier 5B̄ will generate an output of the same polarity as amplifier 5B did when reading a "1", and amplifier 5B may provide a complementary output.

Figure 2:
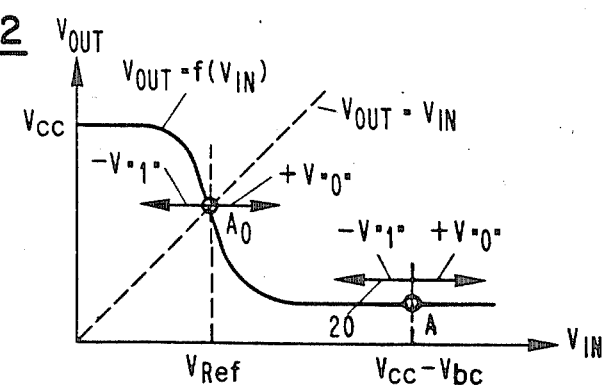
FIG. 2 shows the transfer characteristic of an inverter used as a regular amplifier with operating points A and $A_o$, of a prior art circuit and of a circuit in accordance with the present invention, respectively.

After describing the general operation of the arrangement illustrated in FIG. 1, the problems currently encountered with such memory systems that employ two regular sense amplifiers connected to bit lines B and B̄ will now be outlined with the aid of FIG. 2.

FIG. 2 is the transfer curve $V_{OUT}=f(V_{IN})$ of each of the amplifiers 5B and 5B̄ which are assumed to be identical. The operating point A is determined by bit line voltage level $V_B$ (or $V_{\bar{B}}$) which equals the power supply voltage $V_{cc}$ minus the potential drop $V_{bc}$ at the respective bias circuit 3 or 4. As shown in FIG. 2, unless special measures are taken operating point A is located at a rather high voltage $V_{IN}$ separated from the steep slope, high gain part of the transfer curve. Its stable state output is $V_{OUT}$—0.

Problems arise whenever the (negative) voltage swing occurring on the associated bit line, the direction of which is indicated in the drawing by arrow 20, is not sufficient to have the device "travel" through the steep (high gain) part of the curve. This is particularly critical since the position of A can vary substantially ($\_100$ mV) due to manufacturing tolerances and differing operating conditions whereas the voltage swing is limited (ordinarily in the order of 100 to 150 mV). With added circuitry, point A can be moved to a region where $V_{OUT}\neq 0$, but such measures (such as providing an additional voltage supply) will show the desired result only in limited areas on a semiconductor chip but not across the entire chip unless very extensive efforts are made.

It is thus desirable to provide a sense amplifier where the operating point can be set on the steep part of the $V_{OUT}=f(V_{IN})$ curve, and to define this operating point not only automatically but also largely uneffected by manufacturing tolerances. Such a desired operating point $A_o$ that can be obtained when applying the invention is also indicated in FIG. 2. It is situated at the crossing of the transfer curve with the $V_{OUT}=V_{IN}$ line. A circuit providing for such operation is illustrated in FIG. 3 and will now be described in detail.

Figure 3:
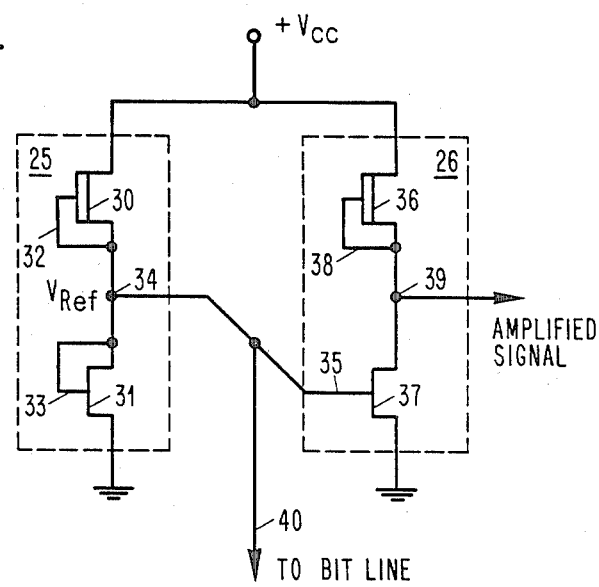
FIG. 3 shows the circuit diagram of a sense amplifier arrangement designed in accordance with the invention which comprises a regular amplifier and an associated reference voltage circuit.

FIG. 3 shows a circuit diagram of an embodiment of the present invention comprising in combination a reference voltage circuit 25 and an associated amplifier 26. In principle, the circuits correspond to blocks 3 (or 4) and 5B (or 5B̄) of FIG. 1, i.e., the reference voltage circuit provides a bit line bias and the amplifier serves to amplify signals appearing on the associated bit line. It should be apparent that one combined reference voltage circuit-amplifier as illustrated in FIG. 3 is required for each of the bit lines B and B̄ in FIG. 1.

Both, the reference voltage circuit 25 and the amplifier 26 basically consist of a depletion-load inverter of the same configuration. In practice, they will be located on the same semiconductor chip in adjacent positions whereby its characteristics are virtually identical. Each of these inverters consists of a pair of series connected depletion- and enhancement-type FET's, 30-31 and 36-37, respectively, that are connected to a voltage source $V_{cc}$ and to ground as shown in FIG. 3. Gate and source of both depletion-type FET's are coupled via connections 32 and 38, respectively. The voltage reference or bias voltage is obtained by connecting, via lead 33, the output 34 of the reference inverter 25 to its input, i.e., to the gate of enhancement-type FET 31. This results in a circuit having a single stable state where $V_{IN} = V_{OUT} = V_{Ref}$. Output 34, on $V_{Ref}$ potential, is connected via line 40 to the associated bit line, e.g., line B, and, furthermore, via line 35 to the amplifier input, i.e., to the gate of FET 37. Prior to a read operation, the bit line is thus charged to the reference or bias voltage level and the operating point of the amplifier is automatically set at $A_o$ (FIG. 2) as desired, i.e., at the intersection of the high gain slope of the transfer curve with the $V_{OUT} = V_{IN}$ line.

During read-out, the word line W is addressed next as explained above in connection with the overall memory arrangement illustrated in FIG. 1. Depending on the binary information ("1" or "0") stored in the cell to be read, i.e., depending on whether transistor T3 or T4 of that cell is conducting, the cell will either supply or draw current from the reference inverter. As a result, one bit-line will be raised in voltage while the other will be lowered. For example, when transistor T3 is conducting (which may be defined as a stored "1"), the cell will draw current from bit line B lowering its voltage to a level below $V_{Ref}$ whereas current will be supplied to bit-line $\overline{B}$ increasing its voltage to a level above $V_{Ref}$. The negative voltage swing $-V\text{"1"}$ on bit line B will then be applied to the input line 35 of the amplifier which is set at operating point $A_o$ as illustrated in FIG. 2. This results in an amplified signal at output 39 of the amplifier. Further amplifier stages not shown will increase the signal to full logic levels.

While, in the example, the amplifier connected to bit line B amplifies the negative signal $-V\text{"1"}$, the second amplifier, connected to bit line $\overline{B}$, at the same time receives the positive signal $+V\text{"1"}$ which, after further amplification results in the complementary logic level signal.

In the case of a stored "0" where T4 of the storage cell is conducting, the amplifier connected to bit line B will receive and amplify a positive signal $+V\text{"0"}$ whereas the second amplifier amplifies negative signal $-V\text{"0"}$. Consequently, the true and complement output signals will be of opposite polarity than those obtained when reading a stored "1".

As already explained above, the reference voltage circuit 25 represents the bias circuit 3 of FIG. 1. It is used instead of the commonly employed so-called pull-up load consisting of a load transistor or a resistor. With the pull-up load hitherto used, the bit line is charged to a level $V_{cc} - V_t$ (supply voltage minus voltage drop across pull-up load), i.e., a voltage that, firstly, sets the amplifier operating point at A (FIG. 2) and which, secondly, is substantially higher than the "toggle" voltage of the memory cell inverters. The toggle voltage being that voltage level that the input of the OFF-inverter must at least reach before switching can occur. In contrast thereto, when employing the inventive circuit of FIG. 3, the bit line is charged to the level of the reference voltage $V_{Ref}$ which is lower than $V_{cc} - V_t$. It properly defines the operating point $A_o$ of the amplifier and, when depletion-load inverters of same characteristics are used in both the reference voltage circuit and the memory cells, it also sets the bit line at the toggle point thereby optimizing the bit line voltage for reliable high speed read-out operations. In summary: circuit 25, like a pull-up load, biases the bit line assuring that no charge remains on the line, its advantage being that it automatically biases the line and the amplifier at optimal voltage levels.

The inverters used in both the reference voltage circuit and the amplifier are preferably the same as those employed in the memory cells. In fact, they need not to be different from those devices currently used in static RAMs. This means, that the inventive circuitry can be fabricated during the same process steps used to produce the memory array and that, furthermore, well known and controllable processes can be employed.

One of the main features of the inventive circuitry is the "tracking" of the semiconductor devices and circuits used. Whenever, due to manufacturing tolerances or operational conditions, the characteristics of one of a number of associated and cooperating devices such as inverters deviate from the desired nominal values, the characteristics of the associated devices deviate "accordingly", i.e., in such a way as to guarantee the same result as if no deviation would have occurred. For example, if $V_{Ref}$ of the reference inverter "moves" due to manufacturing process tolerances, the transfer curve of the associated amplifier will move accordingly, i.e., the relative position of the operating point on the curve remains the same and the deviation does not have any effect on the performance. The use of "tracking" elements and circuits permits substantially larger process tolerances.

Further distinctions and advantages of the herein described circuitry over known arrangements can be listed as follows:

The setting of the amplifiers operating point and of the proper bit line level is fully automatic and does not require any additional circuitry or supply lines which are difficult to adjust when proper operational levels are to be provided to devices distributed over a whole memory chip.

The charging of the bit lines to the memory cells' toggle point permit reliable high speed and low voltge swing read operations.

Both true and complement output signals are provided by the amplifier because of the position of the operating point on the transfer curve (where $V_{OUT} \neq 0$) this providing for simplification of the logic circuitry to which the amplified signals are applied.

The use of inverters as amplifers permits lower power supply voltages as compared to differential amplifiers and, furthermore, requires only a single power supply.

Utilization of the hereinabove described sense amplifier circuitry is not restricted to static RAMs having the configuration shown in FIG. 1. Amplifiers designed in accordance with the teaching of the present invention can be employed in semiconductor array memories and other storage devices whenever a signal on a sense or bit line has to be detected and amplified. In fact, the range of applications of the invention may even be extended to any situation where a deviation from a voltage level that is set by the sense amplifier circuitry itself is to be detected.

While the invention has been particularly shown and described with reference to preferred embodiments thereof, it will be understood by those skilled in the art that various changes in form and details may be made therein without departing from the spirit and scope of the invention.

What is claimed is:

1. A sense amplifying system comprising
an electrically conductive signal line,
amplifying means including a first inverting circuit having an input and an output,
reference voltage generating means including a second inverting circuit having a first transistor, a second transistor connected serially with said first transistor at a common point therebetween, an output at the common point between said transistors connected directly to said conductive signal line and to the input of said amplifying means and an input connected to the output of said reference voltage generating means, and
means for applying voltage signals to said electrically conductive signal line.

2. A sense amplifying system as set forth in claim 1 wherein said first inverting circuit includes third and fourth serially connected transistors and each of said transistors is a field effect transistor.

3. A sense amplifying system as set forth in claim 2 wherein said first and third transistors are depletion-type transistors and said second and fourth transistors are enhancement-type transistors.

4. A sense amplifying system as set forth in claim 3 wherein said first, second and third transistors are arranged as diodes.

5. A sense amplifying system as set forth in claim 4 wherein the output of said second inverting circuit is connected to a gate of the fourth transistor of said first inverting circuit.

6. A sense amplifying system for amplifying signals appearing on a biased line and for generating distinct level digital signals, characterized in that said sense amplifying system comprises
first and second inverter means each having an input and an output,
said first inverter means being arranged to operate as an amplifier for signal amplification and having a transfer curve with a steep slope and an operating point ($A_o$) on the steep slope thereof, and
said second inverter means being arranged to provide a reference voltage to said biased line and to the input of said first inverter means, said second inverter means including first and second serially connected transistors having a common point therebetween with the output of said second inverter means being at the common point, the common point being connected directly to said biased line and to the input of said first inverter means, such that positive and negative signals appearing on said biased line are amplified with high gain about said operating point $A_o$.

7. A sense amplifying system as set forth in claim 6 wherein input and output voltage levels of said second inverting means are equal, whereby the operating point ($A_o$) of the transfer curve of said first inverter means is set at the intersection of the first inverter means transfer curve $V_{OUT}=f(V_{IN})$ with a $V_{OUT}=V_{IN}$ line.

8. A sense amplifying system as set forth in claim 6 wherein said first and second inverter means include depletion-load inverters, each including two series-connected field effect transistors, one being of the depletion-type and serving as a load device, the other being of the enhancement-type.

9. A sense amplifying system for amplifying signals appearing on a biased bit line which, during read operations, is connected to a storage cell of a static random access memory, said signals being representative of the binary value stored in said cell during a read operation characterized in that said sense amplifying system comprises
two field effect transistor inverter circuits,
one of which operates as an amplifier for signal amplification having a transfer curve with a steep slope and having an input and an output, and
the other providing a reference voltage ($V_{Ref}$) to said biased bit line and to the input of said one inverter circuit, said other inverter circuit including a first transistor, a second transistor connected serially with said first transistor at a common point and an output at the common point between said first and second transistors, the common point being directly connected to said biased bit line and to the input of said one inverter circuit, said reference voltage automatically determining an operating point ($A_o$) of said one inverter circuit on the steep slope of the transfer curve such that positive and negative signals appearing on said biased bit line are amplified with high gain.

10. A sense amplifying system as set forth in claim 9 wherein said reference voltage ($V_{Ref}$) biases said bit line to a voltage level corresponding to the toggle voltage of said cell, the toggle voltage being that voltage level that the input of said cell must at least reach before switching can occur.

11. A sense amplifying system as set forth in claim 9 wherein said cell includes inverting circuits, and said field effect transistor inverter circuits are of substantially the same structure and have the same properties as the inverter circuits of said cell.

12. A sense amplifying system as set forth in claim 11, wherein said field effect transistor inverter circuits are disposed on a common semiconductor chip with the inverter circuits of said storage cell.

13. A sense amplifying system as set forth in claim 9 wherein in said other inverter circuit providing said reference voltage ($V_{Ref}$), input and output voltage levels are forced to be equal through an electrical connection, whereby the operating point ($A_o$) of said one inverter circuit is set at the intersection of said one invert circuit transfer curve $V_{OUT}=f(V_{IN})$ with a $V_{OUT}=V_{IN}$ line.

* * * * *